United States Patent
Nishikawa et al.

[11] Patent Number: 5,470,390
[45] Date of Patent: Nov. 28, 1995

[54] MIXED GAS SUPPLY SYSTEM WITH A BACKUP SUPPLY SYSTEM

[75] Inventors: Yukinobu Nishikawa; Yoshinori Hashizume; Takako Kimura, all of Tokyo, Japan

[73] Assignees: Teisan Kabushiki Kaisha, Tokyo, Japan; L'Air Liquide Societe Anonyme Pour L'Etude et L'Exploitation Des Procedes Georges Claude, Paris Cedex, France

[21] Appl. No.: 236,117

[22] Filed: May 2, 1994

[30] Foreign Application Priority Data

May 7, 1993 [JP] Japan .................. 5-107029

[51] Int. Cl.[6] .................................. C23C 16/00
[52] U.S. Cl. .......................... 118/719; 118/715
[58] Field of Search ................... 118/715, 719, 118/726

[56] References Cited

U.S. PATENT DOCUMENTS 3,330,773  7/1967  De Hart, Jr. .
5,279,129  1/1994  Ito ........................... 62/50.2
5,281,295  1/1994  Maeda ..................... 156/345

OTHER PUBLICATIONS

Patent Abstracts of Japan, vol. 7, No. 226 (E-202), Oct. 7, 1983, JP-A-58115812, Jul. 9, 1983.
Patent Abstracts of Japan, vol. 8, No. 184 (C-239), Aug. 23, 1984, JP-A-59080325, May 9, 1984.

Primary Examiner—R. Bruce Breneman
Assistant Examiner—Jeffrie R. Lund
Attorney, Agent, or Firm—Oblon, Spivak, McClelland, Maier, & Neustadt

[57] ABSTRACT

A first MFC 10 and a second MFC 10A are disposed respectively on a silane gas feed line 5 and an inert gas or other dilution gas feed line 19 for feeding a gas for semiconductors such as silane gas or an inert gas or other dilution gas to a mixing chamber 13. A buffer tank 21 is provided which restrains or relieves the pressure energy of the mixed gas coming from the mixing chamber 13 and supplies the same mixed gas to each of a plurality of semiconductor manufacturing units 4 separately. The first MFC 10 and second MFC 10A are actuated to open or close on the basis of an increase or decrease in the pressure value of the mixed gas stored in the buffer tank 21, thereby stopping or starting the feed of the silane gas and the inert gas or other dilution gas again.

14 Claims, 5 Drawing Sheets

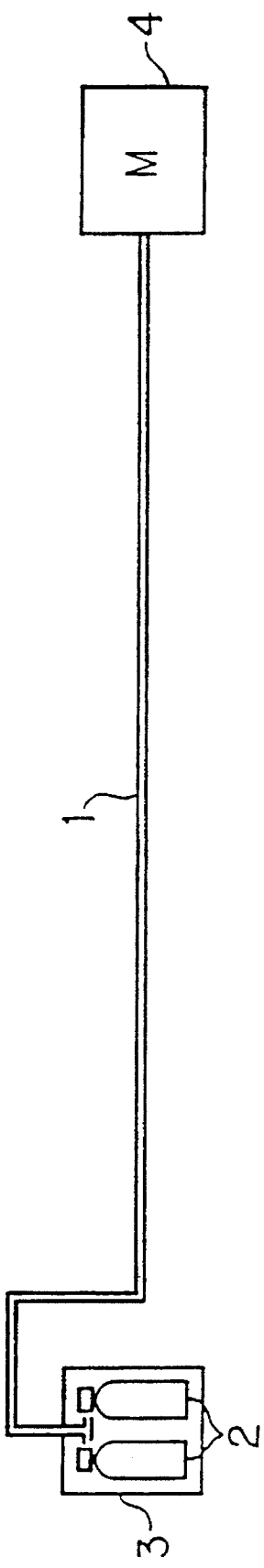
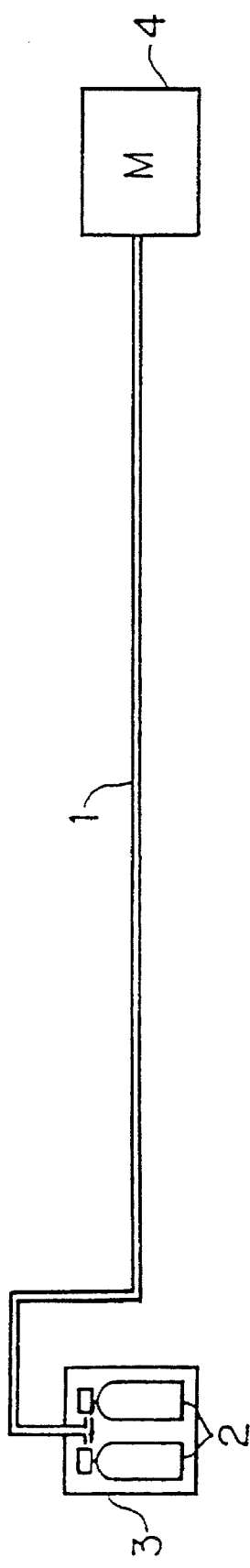
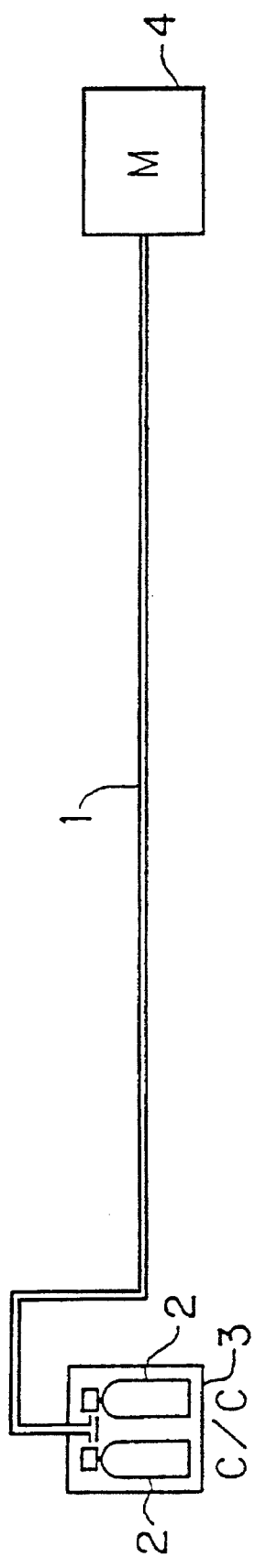
FIG. 5A PRIOR ART
FIG. 5B PRIOR ART
FIG. 5C PRIOR ART

MIXED GAS SUPPLY SYSTEM WITH A BACKUP SUPPLY SYSTEM

BACKGROUND OF THE INVENTION

The present invention relates to a mixed gas supply system which can supply a mixed gas stable in concentration to a plurality of semiconductor manufacturing units by means of one mixer.

DESCRIPTION OF THE PRIOR ART

In the manufacture of semiconductors, a mixed gas (or gas mixture) plays a very important role together with pure water and chemicals. A mixed gas supply system in the prior art has been devised to supply a mixed gas which is a special material gas to each of a plurality of semiconductor manufacturing units 4 separately, as shown in FIG. 5.

One end of a mixed gas supply line 1 is connected to the plurality of said semiconductor manufacturing units (designated by M in FIG. 5) 4, respectively. To the other end of this mixed gas supply line 1 are connected two cylinders 2 for normal use and auxiliary use which store a mixed gas (not shown), respectively.

This cylinder 2 is designed and constructed with high performance, which is at first filled with silane gas ($SiH_4$ gas) with a purity of 100% at a volume of 5%, and secondarily filled with highly pure nitrogen gas ($N_2$ gas) or the like which is a dilution gas at a volume of 95%.

In the viewpoint of weighing the weight of these feed gases accurately when they are filled, a balance (not shown) is used each time.

After the silane gas and nitrogen gas or the like, as the feed gases, are filled in turn, the cylinder 2 is shaken and the aforementioned mixed gas is prepared by virtue of a mixing action accompanied with this shaking operation of the cylinder 2. Then, the purity of the thus-prepared mixed gas is strictly checked, thereby determining whether the cylinders 2 pass the inspection one by one. Two of only the cylinders 2 which have passed the inspection are stored in each of a plurality of cylinder cabinets (designated by C/C in FIG. 5) 3.

Each of the cylinder cabinets 3 holds the two cylinders 2 for normal use and auxiliary use, and further contains an air-tightness checking gas intake line and vent line (not shown), and they are installed in alienation from a use point. The number of the cylinder cabinets 3 to be installed corresponds to that of the semiconductor manufacturing units 4.

Thus, the two cylinders 2 for normal use and auxiliary use which have passed the inspection are stored in each of the plurality of said cylinder cabinets 3, and they will supply the mixed gas separately to each of the plurality of said semiconductor manufacturing units 4 via the mixed gas supply line 1.

The mixed gas supply system of the prior art having the aforementioned structure is very expensive because a plurality of gas cabinets 3 for cylinders have to be installed for each semiconductor manufacturing unit 4.

Since the silane gas and nitrogen gas are filled in turn at the aforementioned mixing ratio into the cylinder 2, the filling operation becomes complicated and intricate, and since the quantity of the silane gas desired to use is only 5%, the cylinders 2 have to be changed frequently.

Furthermore, the complicated filling operation of cylinders of gas is carried out in the semiconductor gas filling factory of a gas supplier, and there is, therefore, the fear of fouling the cylinders 2 or contaminating the gases and there is such a problem that the purity of the mixed gas cannot be maintained at a given value.

SUMMARY OF THE INVENTION

It is an object of the present invention to provide a mixed gas supply system in which the investment in plant and equipment can be remarkably restrained and the operation can be simplified by decreasing the number of the cylinder cabinets, and further the exchange frequency of cylinders can be decreased in a large extent and the fear of contaminating gases can be easily eliminated.

In order to achieve the aforementioned object, according to the present invention, a mixed gas supply system comprises a plurality of gas conduit means for leading each of gases separately, a plurality of flow control means for automatically feeding each of the gases led to the plurality of said gas conduit means, a mixing means for mixing the plural gases coming from the plurality of said gas conduit means to prepare a mixed gas, and a buffer means for relieving the pressure energy of the mixed gas coming from the mixing means, and supplying the same mixed gas to a plurality of consumption means, where the plurality of said flow control means are actuated to open or close on the basis of a change in the pressure value of the mixed gas stored in said buffer means, thereby stopping or starting the feed of the plural gases again.

According to another aspect of the present invention, a mixed gas supply system comprises a plurality of gas conduit means for leading each of the gases separately, a plurality of flow control means for automatically feeding each of the gases led to the plurality of said gas conduit means, a mixing means for mixing the plural gases coming from the plurality of said gas conduit means to prepare a mixed gas for semiconductors, and a buffer means for relieving the pressure energy of the mixed gas coming from the mixing means, and supplying the same mixed gas to a plurality of semiconductor manufacturing means, where the plurality of said flow control means are actuated to open or close on the basis of a change in the pressure value of the mixed gas stored in said buffer means, thereby stopping or starting the feed of the plural gases again.

According to another aspect of the present invention, a flow meter for measuring the flow rate of a gas is disposed on the plurality of said gas conduit means, respectively, wherein when there is an unaccordance in the detection values of said flow meter and the flow control means, another mixed gas independently provided is supplied to the plurality of said semiconductor manufacturing means, respectively. (Although a concentration analyzer for the mixed gas is used together with the flow meter or alone, it is possible to maintain the stable concentration of the mixed gas.)

In order to achieve the aforementioned object, furthermore, according to the present invention, at least one of the plural gases is an inert gas or hydrogen gas, and this inert gas or hydrogen gas is prepared by evaporating a liquefied gas in an independent storage tank by means of an evaporation means or by reducing the pressure of a high pressure gas, and caused to flow from the evaporation means or a pressure reduction means into the mixing means via the gas conduit means.

The present invention provides a simplification of the filling operation of cylinders, reduces or eliminates the risk of falling cylinders or contaminating gases and allows to provide high purity gas mixtures, e.g. for the semiconductor industry.

Since the flow control means is automatically actuated to open or close on the basis of a change in the pressure value of the mixed gas, thereby stopping or starting the feed of plural gases again, it is now possible to prevent a change in the mixing ratio accompanied with the variation in the flow rate of the gases and to maintain the stable concentration of the mixed gas in spite of the change in the flow rate of the gases. When the flow meter detects an abnormality in the flow control means, another mixed gas independently provided is supplied separately to each of the plurality of said semiconductor manufacturing means, in order to maintain a stable concentration of the mixed gas at all times, even if the flow control means is out of order. (Although a concentration analyzer for the mixed gas is used together with the flow meter or alone, it is possible to maintain the stable concentration of the mixed gas.)

Furthermore, the inert purge gas, inert dilution gas or the like is fed to the mixing means from the independent storage tank, or in other words, from the independent feed system, not from an existing supply source, and there is therefore no fear of fouling the cylinders and contaminating the gas at all, thereby preventing the occurrence of any trouble.

BRIEF DESCRIPTION OF THE DRAWINGS

FIG. 5 is a whole view of the mixed gas supply system in the prior art.

Figure 1:
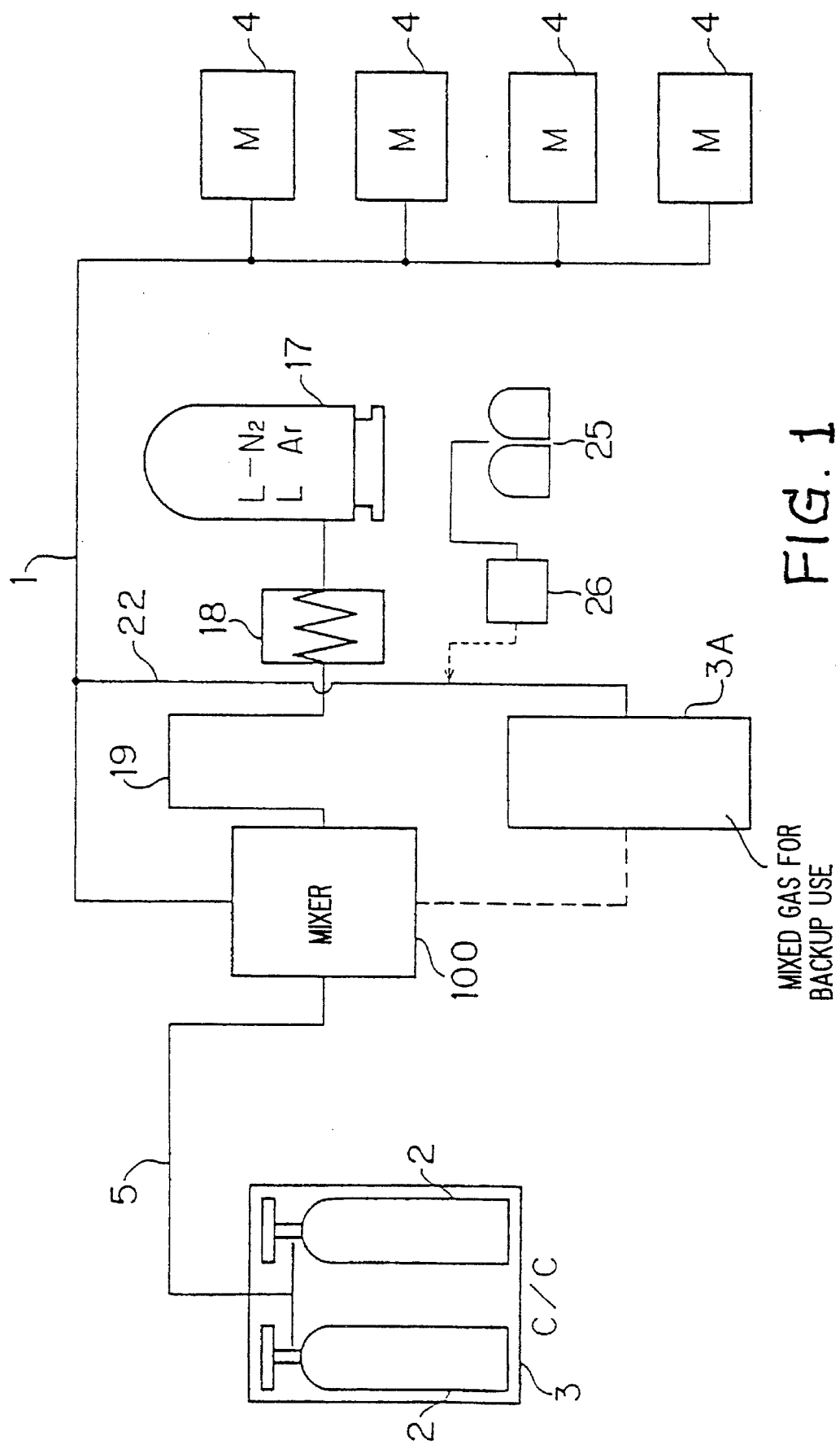
FIG. 1 is a whole view of one embodiment of the mixed gas supply system according to the present invention.

On these figures, the reference numerals have the following meaning:

2—cylinder, 3, 3A—cylinder cabinet, 4—semiconductor manufacturing unit (consumption means, semiconductor manufacturing means), 5—silane gas feed line (gas conduit means), 7, 7A, 7B—pressure sensor (PIA), 9, 9A, 9B, 9C, 9D—air valve, 10, 10A—MFC (flow control means), 12, 12A—MFM (flow meter), 13—mixing chamber (mixing means), 17—storage tank, 18—evaporator (evaporation means), 19—nitrogen gas feed line (gas conduit means), 21—buffer tank (buffer means), 22—backup line, 25—cylinder, 26—pressure reducing device, 100—mixer, 200—preliminary supply system.

DETAILED DESCRIPTION OF THE INVENTION

The present invention will be described in detail, referring to one embodiment shown in FIG. 1 and FIG. 2.

As shown in FIG. 1, the mixed gas supply system according to the present invention is designed to mix silane gas and nitrogen gas which are feed gases in a mixer 100, thereby preparing a mixed gas, and to supply the mixed gas to each of a plurality of semiconductor manufacturing units 4 separately.

The silane gas (expressed by $SiH_4$ in FIG. 2) is filled, as shown in FIG. 1, into two cylinders 2 which are designed and constructed with high performance, at a purity of 100% and a defined volume, respectively. One of these two cylinders 2 is adapted for normal use and the other is for auxiliary use, respectively.

As shown in the same figure, the two cylinders 2 are stored in a cylinder cabinet (designated by C/C in FIG. 2) 3, to which the upstream end of a silane gas feed line (gas conduit means) 5 which serves to feed the silane gas is connected, and the remainder portion of the silane gas feed line 5 is disposed in hiding in the inside of the mixer 100.

Figure 2:
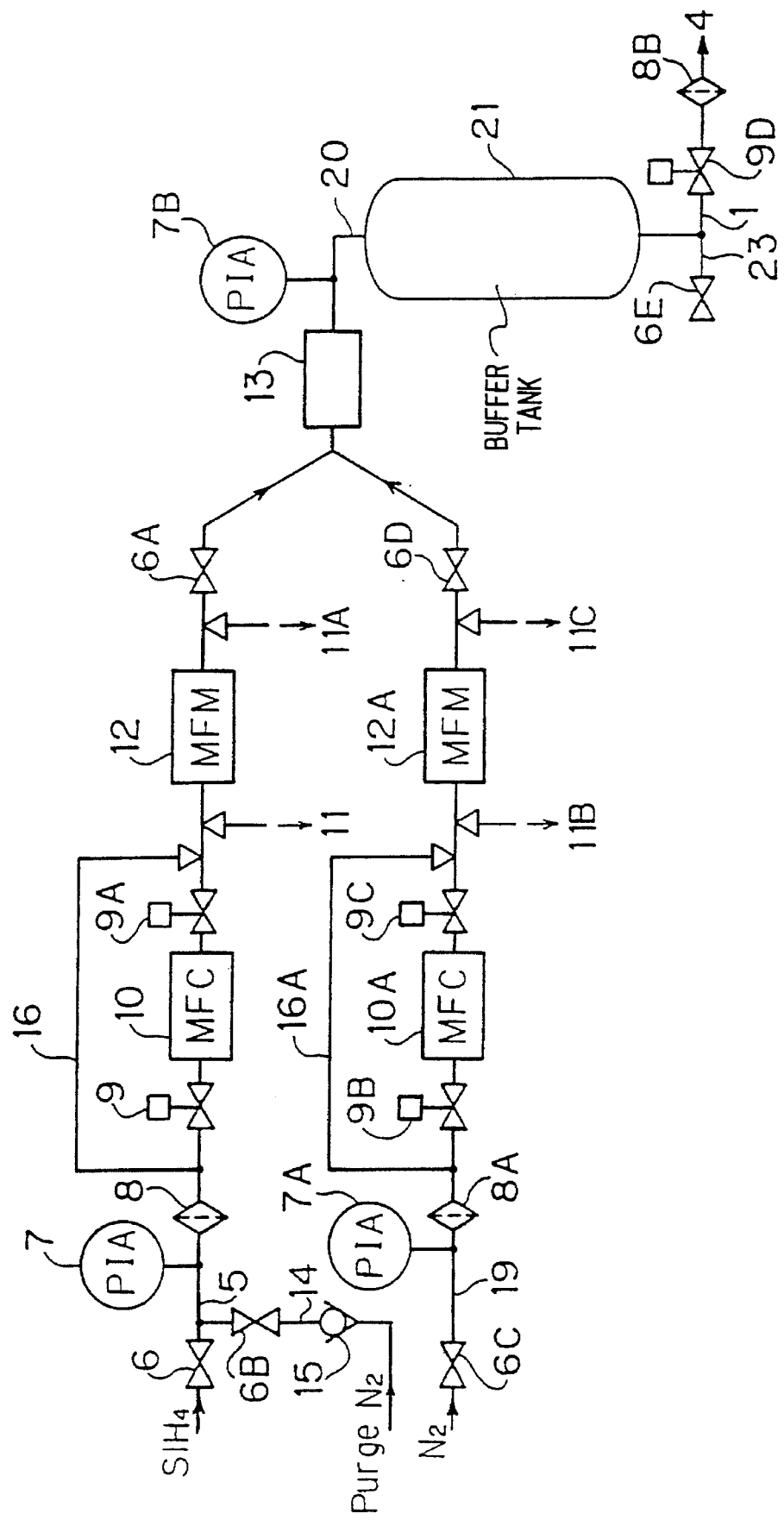
FIG. 2 is an illustrative view of the internal structure of the mixer in the mixed gas supply system according to the present invention.

To the upstream portion of the silane gas feed line 5 in the inside of the mixer 100, as shown in FIG. 2, are connected a first stop valve 6 for regulating the flow of silane gas, and besides a first pressure sensor (which will be hereinafter called PIA) 7 for monitoring the pressure of silane gas. The whole system is designed to stop when the first PIA 7 detects an abnormal value.

To the silane gas feed line 5 downstream of the first PIA 7 are connected a first filter 8 which serves to filter the silane gas, a first air valve 9 for regulating the flow of the filtered silane gas by the drive of its air cylinder, and further a first mass flow controller (which will be hereinafter called MFC) 10.

This first MFC (flow control means) 10 comprises in combination a thermal mass flow sensor, control valve and electric circuit (not shown), which functions to automatically feed the silane gas passed through the first air valve 9 downstream.

In addition, the first MFC 10 is originally constructed so as to be variable by 10~100% in structure. However, if its variation is allowed, the mixing concentration of a mixed gas could not be probably maintained at a given value. Accordingly, it is set so as to operate in a 100% situation capable of maintaining the mixing concentration at a given value, at all times, whereby the mixing ratio can be restrained and maintained. As to this point, the same may be said to a second MFC 10A which will be mentioned below.

To the silane gas feed line 5 downstream of the first MFC 10 are connected a second air valve 9A for regulating the flow of the silane gas passed through the first MFC 10 by the drive of its air cylinder, a first flow-dividing valve 11 for carrying out the calibration of the first MFC 10, and further a first mass flow meter (which will be hereinafter called MFM) 12 which is of a flow meter.

In addition, although the aforementioned first air valve 9, first MFC 10 and second air valve 9A are separately provided on the silane gas feed line 5 in FIG. 2, they are assembled, in fact, as one body so that the volume between each of them is made as small as possible.

The first MFM 12 performs the function of detecting as an amperage a temperature difference which is generated between two self-heating resistors wound on the outer periphery of a metallic capillary tube (not shown) in proportion to the mass flow of the silane gas, and it is characterized by being low in pressure loss and highly precise.

Furthermore, the first MFM 12 functions to detect an abnormality in the first MFC 10 when an unaccordance takes place between its detection value and that of the first MFC 10, and to switch over a feed source for the mixed gas (please see FIG. 1). This point will be mentioned below.

To the silane gas feed line 5 downstream of the first MFM 12 are connected a second flow-dividing valve 11A for carrying out the calibration of the first MFM 12 and besides a second stop valve 6A for regulating the flow of the silane gas passed through the second flow-dividing valve 11A, wherein the silane gas passed through the second stop valve 6A is permitted to flow into a mixing chamber (mixing means) 13 as shown by an arrowmark.

On the other hand, to the silane gas feed line 5 downstream of the first stop valve 6 is connected the downstream portion of a purge gas feed line 14 for feeding nitrogen gas for purge use (as indicated by Purge $N_2$ in FIG. 2).

To this purge gas feed line 14 are connected a check valve 15 for preventing the silane gas from flowing back to the same purge nitrogen gas feed line 14 and a third stop valve 6B for regulating the flow of the purge nitrogen gas passed through the check valve 15.

In addition to the connection of this purge gas feed line 14, a first by-path line 16 for leading the purge nitrogen gas passed through the first filter 8 to the upstream side of the first flow-dividing valve 11 is connected in bypassing to the silane gas feed line 5 in the vicinity of the first MFC 10.

Thus, the purge nitrogen gas is permitted to flow from the purge gas feed line 14 into the silane gas feed line 5 so as to function to expel the silane gas remaining in the silane gas feed line 5 to the outside, thereby preventing explosion. Namely, it serves to purge the silane gas feed line 5.

As shown in FIG. 1, on the other hand, the aforementioned nitrogen gas ($N_2$ gas) of high purity is prepared as liquid nitrogen stored in a storage tank 17 is evaporated by means of an evaporator (evaporation means) 18, and it is fed into the mixer 100 via a nitrogen gas feed line (gas conduit means) 19 independent of this evaporator 18.

In addition, this embodiment has been described only by using a preparing procedure of nitrogen gas which comprises evaporating liquid nitrogen stored in the storage tank 17 by means of the evaporator 18 to prepare the aforementioned nitrogen gas of high purity. However, there may be used another procedure which comprises, for example as shown in FIG. 1, reducing the pressure of an inert gas of high pressure (such as $N_2$, Ar or He gas) stored in a plurality of cylinders 25 by means of a pressure reducing device 26 to prepare the inert gas, not limited to the aforementioned preparing procedure.

The nitrogen gas feed line 19 in the mixer 100 is, as shown in FIG. 2, disposed in parallel to the silane gas feed line 5. To the upstream portion thereof are connected a fourth stop valve 6C for regulating the flow of the nitrogen gas, and besides a second PIA 7A for monitoring the pressure of the nitrogen gas. The whole system is designed to stop when this second PIA 7A detects an abnormal value.

To the nitrogen gas feed line 19 downstream of the second PIA 7A are connected a second filter 8A which serves to filter the nitrogen gas, a third air valve 9B for regulating the flow of the filtered nitrogen gas by the drive of its air cylinder, and further a second MFC 10A.

This second MFC 10A also comprises in combination a thermal mass flow sensor, control valve and electric circuit (not shown), which functions to automatically feed the nitrogen gas passed through the third air valve 9B downstream.

In addition, a second bypath line 16A for leading the nitrogen gas passed through the second filter 8A to the upstream side of a third flow-dividing valve 11B which will be mentioned below is connected in bypassing to the nitrogen gas feed line 19 in the vicinity of the second MFC 10A. This second bypath line 16A is connected in the viewpoints of purging the silane gas feed line 5 and preventing the silane gas from flowing back.

To the nitrogen gas feed line 19 downstream of the second MFC 10A are connected a fourth air valve 9C for regulating the flow of the nitrogen gas passed through the second MFC 10A by the drive of its air cylinder, a third flow-dividing valve 11B for carrying out the calibration of the second MFC 10A, and further a second MFM 12A which is a flow meter.

Similarly to the first air valve 9, second air valve 9A and third air valve 9B, the fourth air valve 9C is connected in the viewpoint of interrupting the leakage of the silane gas or nitrogen gas from the first MFC 10 or second MFC 10A with certainty.

Although the aforementioned third air valve 9B, second MFC 10A and fourth air valve 9C are also separately provided on the nitrogen gas feed line 19 in FIG. 2, they are assembled, in fact, as one body so that the volume between each of them is made as small as possible.

The second MFM 12A also performs the function of detecting as an amperage a temperature difference which is generated between two self-heating resistors wound on the outer periphery of a metallic capillary tube (not shown) in proportion to the mass flow of the nitrogen gas, and it is characterized by being low in pressure loss and highly precise.

Furthermore, this second MFM 12A functions to detect an abnormality in the second MFC 10A when an unaccordance takes place between its detection value and that of the second MFC 10A, and to switch over a feed source for the mixed gas (please see FIG. 1). This point will be also mentioned below.

To the nitrogen gas feed line 19 downstream of the second MFM 12A are connected a fourth flow-dividing valve 11C for carrying out the calibration of the second MFM 12A, and beside a fifth stop valve 6D for regulating the flow of the nitrogen gas passed through the fourth flow-dividing valve 11C, wherein the nitrogen gas passed through this fifth stop valve 6D is permitted to flow into the mixing chamber 13 as shown by an arrowmark.

Similarly to the first flow-dividing valve 11, second flow-dividing valve 11A and third flow-dividing valve 11B, this fourth flow-dividing valve 11C is also connected for use in the purging operation and maintenance operation, in the viewpoint of operating the first MFC 10, second MFC 10A, first MFM 12 and second MFM 12A in a stable condition for a long period of time.

The mixing chamber 13 has a well-known static mixer (not shown) built therein, and functions to mix the silane gas and nitrogen gas which come therein while they produce turbulent currents, at a given mixing ratio, thereby preparing a mixed gas necessary for manufacture of semiconductors.

The thus-prepared mixed gas is intermittently fed from the mixing chamber 13 to a buffer tank (buffer means) 21 downstream thereof via a feed line 20.

To the feed line 20 is connected a third PIA 7B for monitoring the internal pressure of the buffer tank 21, wherein the first MFC 10 and second MFC 10A are actuated to open or close on the basis of the detection value of this third PIA 7B.

Namely, when the third PIA 7A detects a pressure value of 2.5 kg/cm$^2$G, in order to cope with various flow rates, the first air valve 9, first MFC 10, second air valve 9A, third air valve 9B, second MFC 10A and fourth air valve 9C are automatically actuated to close, thereby stopping the feed of the silane gas and nitrogen gas.

On the contrary, when the third PIA 7B detects a reduced pressure value of 1.8 kg/cm²G as the mixed gas is used, all the first air valve 9, first MFC 10, second air valve 9A, third air valve 9B, second MFC 10A and fourth air valve 9C which have been closed are automatically actuated to open, thereby starting the feed of the silane gas and nitrogen gas again to prepare the mixed gas.

The buffer tank 21 comprises a hollow tank polished on its inner surface, and functions to restrain and relieve the pressure energy of the mixed gas which is coming thereto as it is limited in a given pressure range and to supply the mixed gas stored therein to anyone of a plurality of semiconductor manufacturing units (semiconductor manufacturing means) 4 or vacuum pumps (not shown).

To a mixed gas supply line 1, by which the buffer tank 21 and the plurality of said semiconductor manufacturing units (designated by M in FIG. 1) 4 are connected, there are connected a fifth air valve 9D for regulating the flow of the mixed gas by the drive of its air cylinder, and besides a third filter 8B for filtering the mixed gas passed through this fifth air valve 9D.

Further to the mixed gas supply line 1 is connected a backup line 22, as shown in FIG. 1, wherein to this backup line 22 is connected a cylinder (not shown) filled with a mixed gas for backup use. This cylinder is stored in another cylinder cabinet 3A.

The mixed gas for backup use has the same concentration as the mixed gas prepared in the mixing chamber 13, and it is supplied from the same cylinder separately to each of the plurality of said semiconductor manufacturing units 4 via the backup line 22 and mixed gas supply line 1 in turn, when the aforementioned first MFM 12 or second MFM 12A detects an abnormality in the first MFC 10 or second MFC 10A.

Moreover to a flow-dividing line 23, by which the buffer tank 21 and the vacuum pump are connected, there is connected a sixth stop valve 6E for regulating the flow of the mixed gas. This vacuum pump will be used in the purging operation or maintenance operation.

Accordingly, the supply of a mixed gas to the plurality of said semiconductor manufacturing units 4 can be realized only by feeding silane gas to the silane gas feed line 5 and nitrogen gas to the nitrogen gas feed line 19, respectively.

Thus, silane gas with a purity of 100% is caused to flow from the cylinder 2 into the mixing chamber 13 of the mixer 100 via the silane gas feed line 5, and during the flowing thereof, its flow rate is automatically regulated and controlled by means of the first MFC 10.

Similarly to the feed of the silane gas, highly pure nitrogen gas is prepared as liquid nitrogen stored in the storage tank 17 is evaporated by means of the evaporator 18, and caused to flow from the evaporator 18 into the mixing chamber 13 of the mixer 100 via the nitrogen gas feed line 19.

Owing to the fact that the nitrogen gas which is a dilution gas is fed from the independent storage tank 17, not from a nitrogen source already existing in a semiconductor manufacturing factory, as mentioned above, there is no fear of contaminating the nitrogen gas at all and it can be expected to prevent the occurrence of any trouble, thereby improving the safety. Also as to the nitrogen gas, its flow ram is automatically regulated and controlled by means of the second MFC 10A so as to maintain its mixing ratio during the flowing thereof.

When the silane gas and nitrogen gas have flowed into the mixing chamber 13, respectively, the mixing chamber 13 mixes the silane gas and nitrogen gas at a given mixing ratio to prepare a mixed gas necessary for manufacture of semiconductors (for example, a mixed gas with a concentration of 5%), and this mixed gas is passed through the feed line 20 and temporally stored in the buffer tank 21.

Thus, the buffer tank 21 restrains and relieves the pressure energy of the mixed gas coming thereto, and supplies the mixed gas temporally stored therein to each of the plurality of said semiconductor manufacturing units 4 separately, and then the plurality of these units 4 will manufacture semiconductors (not shown).

When the third PIA 7B detects an elevated pressure value of 2.5 kg/cm²G in the buffer tank 21 in the supply of the mixed gas, the first air valve 9, first MFC 10, second air valve 9A, third air valve 9B, second MFC 10A and fourth air valve 9C are automatically actuated to close, thereby stopping the feed of the silane gas and nitrogen gas so that the flow rates and concentrations of these silane gas and nitrogen gas are regulated.

And, when the third PIA 7B detects a reduced pressure value of 1.8 kg/cm²G in the buffer tank 21 with the use of the mixed gas, all the first air valve 9, first MFC 10, second air valve 9A, third air valve 9B, second MFC 10A and fourth air valve 9C which have been closed are automatically actuated to open, thereby starting the feed of the silane gas and nitrogen gas again so that the mixed gas is prepared again. Then, the aforementioned operations will be repeated.

Owing to the aforementioned construction, the mixing chamber 13 mixes the silane gas and nitrogen gas at a given mixing ratio to prepare the mixed gas, and there is, therefore, no necessity of installing extremely expensive cylinder cabinets 3 for the number of the semiconductor manufacturing units 4, as can be seen from the comparison of FIG. 1 to FIG. 5. Accordingly, it can be achieved to restrain the investment in plant and equipment by virtue of the decrease of the mixing gas supply line 1 and cylinder cabinets 3.

Furthermore there is no necessity of filling the cylinders 2 with the silane gas and nitrogen gas in turn in the semiconductor gas filling factory of a gas supplier, and the complex filling work can be therefore simplified. Since the silane gas desired to use can be filled at a purity of 100% and a defined volume in the cylinders 2, it is possible to decrease the exchange frequency of the cylinders 2, as compared with the prior arts.

Since the mixed gas is directly prepared in the inside of the mixing chamber 13 while its filling operation is not carried out in the semiconductor gas filling factory of a gas supplier, it is possible to eliminate the fouling of the cylinders 2 and the contamination of the gas and to it can be expected to maintain the high purity of the mixed gas.

Owing to the fact that the feed of the silane gas and nitrogen gas is stopped or started again on the basis of the pressure value of the buffer tank 21 which the third PIA 7B has detected, or in other words, the buffer tank 21 controls the flow rate of the silane gas and nitrogen gas substantially, it is possible to prevent the change in the mixing ratio of them accompanied with the variation of their flow rate, thereby enabling to maintain the stable concentration of the mixed gas in spite of the number of the semiconductor manufacturing units 4 operated.

Moreover, when the first MFM 12 or second MFM 12A detects an abnormality in the first MFC 10 or second MFC 10A, or in other words, detects an abnormality in the mixing concentration, the mixed gas for backup use is supplied separately to each of the plurality of said semiconductor manufacturing units 4 via the backup line 22 and mixed gas supply line 1, and it is therefore possible to expect the stable concentration of the mixed gas at all times, even if the first MFC 10 or second MFC 10A is out of order.

Furthermore, since the nitrogen gas is fed to the mixer 100, as mentioned above, from the independent storage tank 17, or in other words, from an independent feed system, not from a nitrogen source existing in the semiconductor manufacturing factory, there is no feat of contaminating the same nitrogen gas, and it is obviously possible to prevent the occurrence of any trouble, thereby improving the safety.

Although the use of silane gas and nitrogen gas in combination has been described in the aforementioned embodiment, other gases as phosphine may be used in lieu of these gases, if they are gases necessary for manufacturing semiconductors.

Although the use of nitrogen gas as a dilution gas has been described also in the aforementioned embodiment, it is not to say that instead of the nitrogen gas, another dilution gas such as Ar, He or $H_2$ may be used.

In the aforementioned embodiment, there has been described the use of two paths, i.e. the nitrogen gas feed line 19 and silane gas feed line 5. Even if the number of paths is increased in accordance with the increase of used gases, however, the same operational effects as in the aforementioned embodiment could be obtained.

Moreover, in the aforementioned embodiment, there has been described the use of the mixing chamber 13 having a static mixer build therein. In place of the static mixer, however, the inner pipe of the mixing chamber 13 may be wound in a coil-form or said pipe may be divided into a plurality of slender pipes very small in diameter. Even if the mixing chamber is designed to be of a structure having no static mixer in case there is no change in the mixing accuracy, the same operational effect as in the aforementioned embodiment could be expected.

Although the automatic opening or closing actuation of the first air valve 9, first MFC 10, second air valve 9A, third air valve 9B, second MFC 10A and fourth air valve 9C based on the detection values of 2.5 kg/cm$^2$G and 1.8 kg/cm$^2$G has been described in the aforementioned embodiment, there is no limitation in these detection values, at all.

In addition, the mixed gas supply system according to the present invention is not always limited to the manufacturing field of semiconductors. Namely, it is not to say that this mixed gas supply system can be adapted to other fields of requiring a mixed gas with high accuracy, for instance a welding field and glass coating field.

Figure 3:
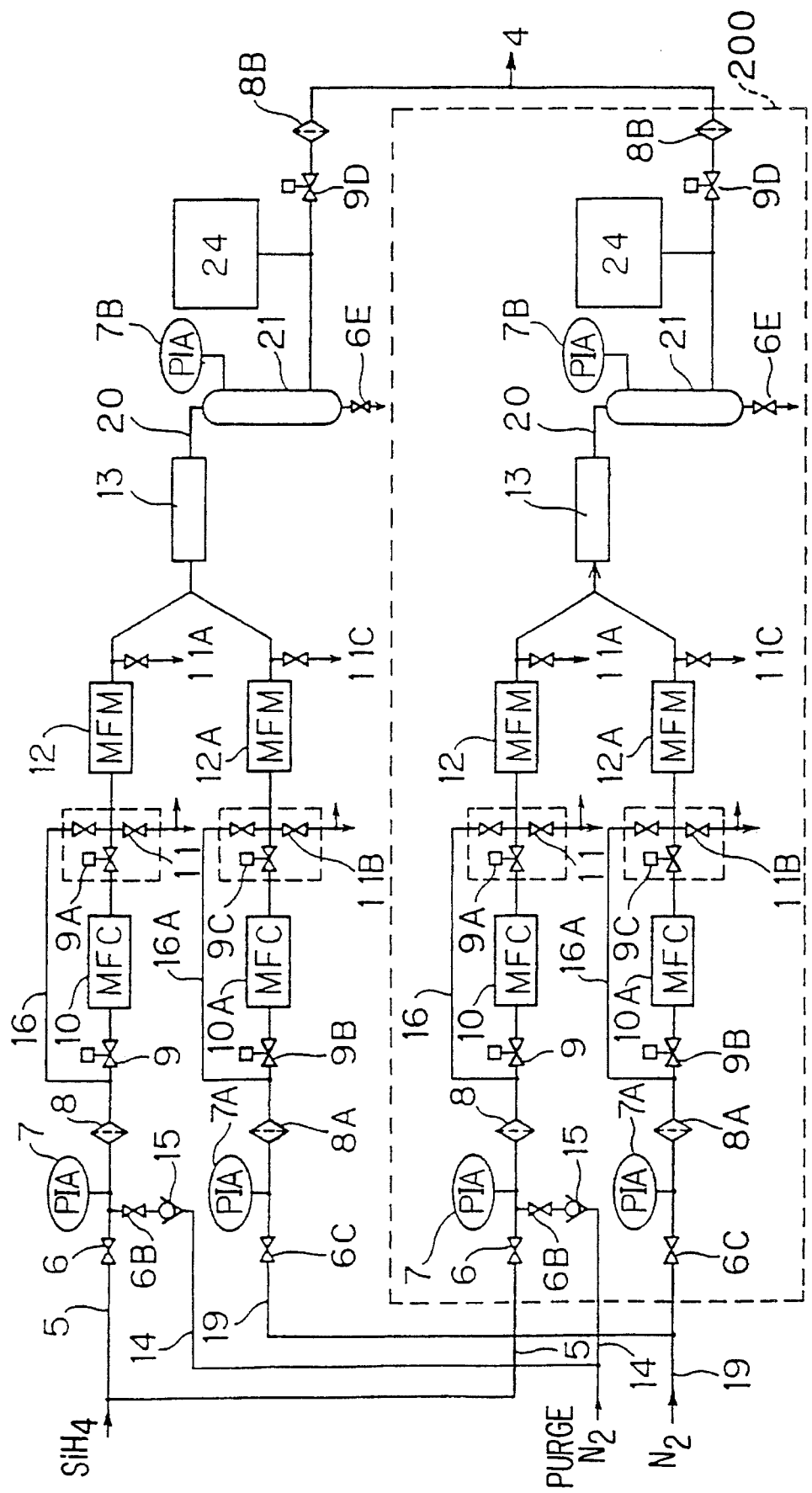
FIG. 3 is a schematic view of another embodiment of the mixed gas supply system according to the present invention, which corresponds to FIG. 2.

In the aforementioned embodiment, moreover, there has been described the separate supply of the mixed gas for backup use to each of the plurality of said semiconductor manufacturing units 4 based on the detection of an abnormality in the first MFM 12 or second MFM 12A. Even if another supply system 200 which has a structure almost equal to the mixed gas supply system according to the aforementioned embodiment is preliminarily juxtaposed thereto and a mixed gas for backup use is supplied from this preliminary supply system 200 as shown in FIG. 3, however, the same operational effect as in the aforementioned embodiment could be obtained.

Moreover, even if a plurality of analyzers 24 which perform the same function as the first MFM 12 and second MFM 12A are further installed as shown in the same figure, the same operational effect as in the aforementioned embodiment could be expected. In this case, it can be obviously more expected to improve the safety and to maintain the concentration of the mixed gas.

Figure 4:
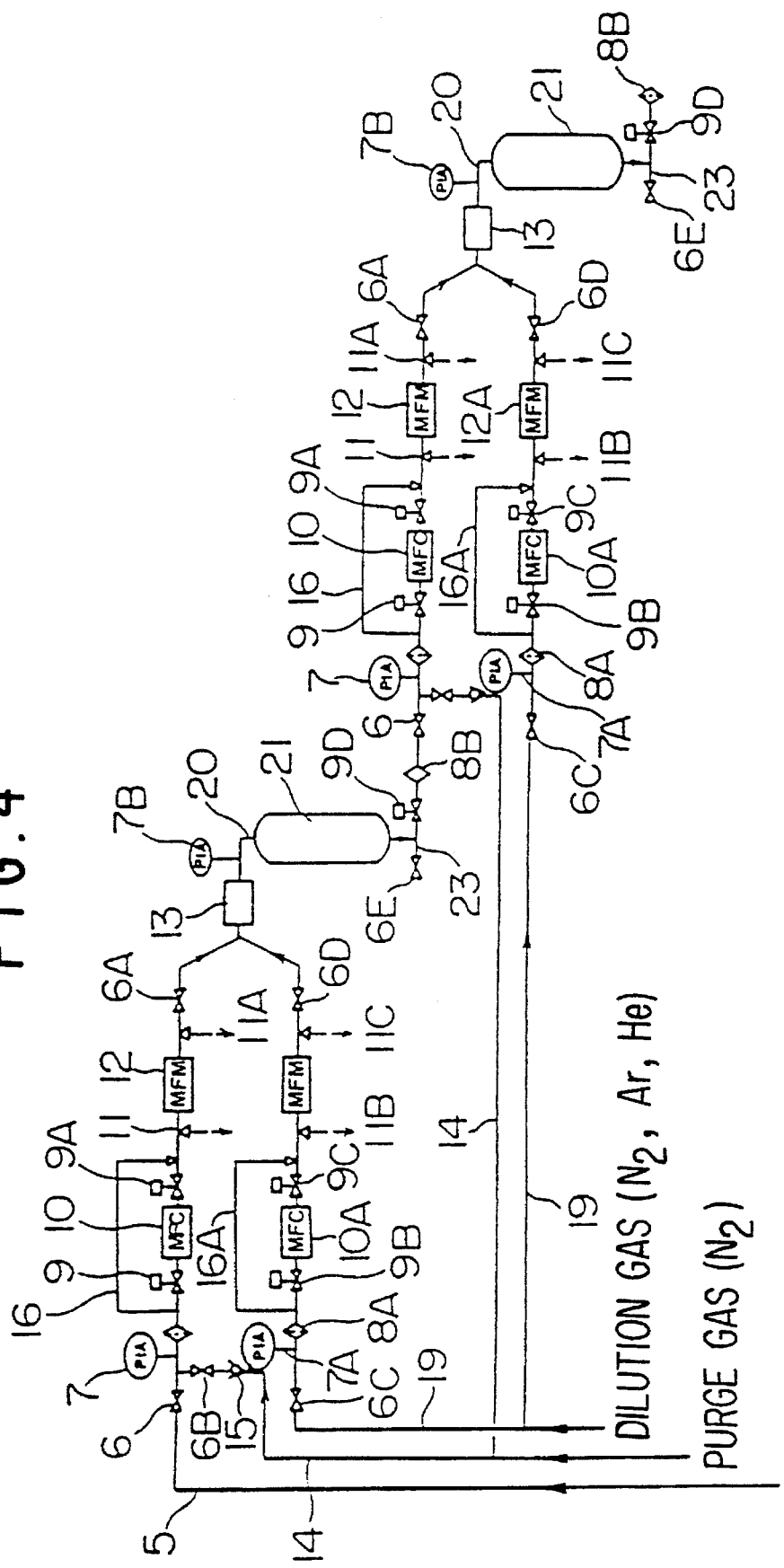
FIG. 4 is a schematic view of a further embodiment of the mixed gas supply system according to the present invention, which corresponds to FIG. 2.

Furthermore, even if a further supply system 300 which has a structure almost equal to the mixed gas supply system according to the aforementioned embodiment is installed in multistage thereto and the diluting operation is carded out in two or more stages, as shown in FIG. 4, the same operational effect as in the aforementioned embodiment could be expected. Also in this case, it can be obviously more expected to maintain the concentration of the mixed gas. According to this supply system, it is enabled to prepare a dilution gas with a lower concentration.

Since the buffer means controls the flow rate of plural gases differently from the prior art, the concentration of the mixed gas is maintained extremely stable, even if a change in the flow ram of these gases occur.

Moreover, since another mixed gas is supplied separately to each of the plurality of said semiconductor manufacturing means when an abnormality in the mixing concentration is detected, the concentration of the mixed gas is maintained stable at all times, even if the flow control means is out of order.

Furthermore, since the nitrogen gas is fed to the mixing means from an independent feed system, not from an existing nitrogen source, there is no feat of contaminating the same nitrogen gas and there is an excellent effect capable of improving the safety by virtue of the prevention of the occurrence of any trouble.

We claim:

1. A system for supplying gas mixtures for the manufacture of semiconductors, which comprises:
   a) a first supply system, comprising:
      i) a plurality of flow control means for automatically feeding a plurality of gases separately from separate sources to a plurality of gas conduit means fluidly connected thereto;
      ii) a plurality of gas conduit means;
      iii) mixing means fluidly connected to said plurality of said gas conduit means for mixing the plurality of gases flowing from the plurality of said gas conduit means for preparing a gas mixture; and
      iv) buffer means for relieving the pressure energy of the gas mixture to, and in fluid connection with, a plurality of consumption means, at least one of which is a semiconductor manufacturing means; and
   b) a second, or backup, supply system in fluid connection with and juxtaposed proximally to said first system, said second, or backup, supply system also being in fluid connection with said plurality of consumption means.

2. The system of claim 1, wherein said plurality of flow control means are actuated to open or close on the basis of a change in a pressure value of a mixed gas mixture stored in said buffer means, thereby stopping or starting again the feed of the plurality of gases to the plurality of consumption means.

3. The system of claim 1, wherein said second, or backup, supply system is substantially equal to said first system in structure.

4. The system of claim 1, wherein said first and second, or backup, supply systems are in fluid connection with each other at a point immediately upstream of said plurality of consumption means.

5. The system of claim 1, wherein all of said consumption means are semiconductor manufacturing means.

6. The system of claim 1, wherein said second, or backup, supply system comprises:
   i) a plurality of flow control means for automatically feeding a plurality of gases separately from separate sources to a plurality of gas conduit means fluidly connected thereto;

ii) a plurality of gas conduit means;

iii) mixing means fluidly connected to said plurality of said gas conduit means for mixing the plurality of gases flowing from the plurality of said gas conduit means for preparing a gas mixture; and iv) buffer means for relieving the pressure energy of the gas mixture to, and in fluid connection with, said plurality of consumption means.

7. The system of claim 1, wherein at least one gas of the plurality of gases is an inert gas or hydrogen gas, said inert gas or hydrogen gas being prepared by evaporating a liquified gas in an independent storage tank by means of an evaporation means or by reducing the pressure of a high pressure gas, and causing said gas to flow from the evaporation means or a pressure reducing means into the mixing means via the gas conduit means.

8. The system of claim 1, wherein at least one gas of the plurality of gases is nitrogen gas, said nitrogen gas being prepared by evaporating liquid nitrogen in an independent storage tank by means of evaporation means, and causing said gas to flow from the evaporation means into the mixing means via the gas conduit means.

9. The system of claim 1, wherein said first supply system comprises upstream of said mixing means, flow control means and, downstream thereof but upstream of said mixing means, flow meter means for detecting abnormal mixing concentrations from said flow control means.

10. The system of claim 6, wherein said second supply system comprises, upstream of said mixing means, flow control means and, downstream thereof but upstream of said mixing means, flow meter means for detecting abnormal mixing concentrations from said flow control means.

11. The system of claim 1, wherein said mixing means of said first supply system comprises a static mixer therein.

12. The system of claim 1, wherein said mixing means of said first supply system comprises an inner pipe therein which is either wound in coil-form or said inner pipe is divided into a plurality of smaller diameter pipes.

13. The system of claim 6, wherein said mixing means of said second supply system comprises a static mixer therein.

14. The system of claim 1, wherein said mixing means of said second supply system comprises an inner pipe therein which is either wound in coil-form or said inner pipe is divided into a plurality of smaller diameter pipes.

* * * * *

UNITED STATES PATENT AND TRADEMARK OFFICE
CERTIFICATE OF CORRECTION

PATENT NO.   : 5,470,390
DATED        : NOV. 28, 1995
INVENTOR(S)  : NISHIKAWA ET AL.

It is certified that error appears in the above-identified patent and that said Letters Patent is hereby corrected as shown below:

In col. 3, line 1, please replace "falling" with --failing--.

In col. 5, line 16, please replace "by-path" with --bypath--.

In col. 10, line 14, please replace "ram" with --rate--.

Signed and Sealed this

Nineteenth Day of March, 1996

Attest:

BRUCE LEHMAN

Attesting Officer    Commissioner of Patents and Trademarks